United States Patent
Kumar et al.

(10) Patent No.: US 11,915,745 B2
(45) Date of Patent: Feb. 27, 2024

(54) LOW STANDBY LEAKAGE IMPLEMENTATION FOR STATIC RANDOM ACCESS MEMORY

(71) Applicant: DXCorr Design Inc., Sunnyvale, CA (US)

(72) Inventors: Sudarshan Kumar, Barauni (IN); Mayank Tayal, Bangalore (IN); Sagar Vidya Reddy, Santa Clara, CA (US)

(73) Assignee: DXCorr Design Inc., Sunnyvale, CA (US)

( * ) Notice: Subject to any disclaimer, the term of this patent is extended or adjusted under 35 U.S.C. 154(b) by 125 days.

(21) Appl. No.: 17/475,386

(22) Filed: Sep. 15, 2021

(65) Prior Publication Data

US 2023/0080591 A1 Mar. 16, 2023

(51) Int. Cl.
 *G11C 11/419* (2006.01)
 *G11C 11/412* (2006.01)
 *G11C 11/418* (2006.01)

(52) U.S. Cl.
 CPC .......... *G11C 11/419* (2013.01); *G11C 11/412* (2013.01); *G11C 11/418* (2013.01)

(58) Field of Classification Search
 CPC ............ G11C 11/2253; G11C 11/1653; G11C 11/418; G11C 11/419; G11C 11/412; G11C 8/10; G11C 5/148; G11C 5/144; G11C 5/14
 USPC .......................................................... 365/165
 See application file for complete search history.

(56) References Cited

U.S. PATENT DOCUMENTS

| | | | | |
|---|---|---|---|---|
| 7,643,357 | B2 * | 1/2010 | Braceras | G11C 11/417 365/156 |
| 10,811,086 | B1 * | 10/2020 | Mohanty | G11C 11/419 |
| 2003/0189221 | A1 * | 10/2003 | Takemura | G11C 11/412 257/200 |
| 2009/0129192 | A1 * | 5/2009 | Barth, Jr. | G11C 8/12 365/230.06 |
| 2013/0077387 | A1 * | 3/2013 | Yabuuchi | G11C 11/419 365/154 |
| 2021/0183436 | A1 * | 6/2021 | Chhabra | G11C 11/419 |

* cited by examiner

*Primary Examiner* — Sung Il Cho
(74) *Attorney, Agent, or Firm* — Jason C. Cameron

(57) ABSTRACT

A memory architecture for optimizing leakage currents in standby mode and a method thereof is disclosed. The memory architecture includes a plurality of memory segments configured to operate in one or more modes of operations. The plurality of memory segments includes a plurality of decoder slices. Each of the plurality of decoder slice includes a plurality of wordlines running in the row direction; at least one array power header configured for controlling leakage currents within each of the plurality of decoder slice in the row direction; and a retention header. Each of the plurality of power supply rails running in the column direction are segmented within one or more decoder slice to form one or more segmented power supply node.

13 Claims, 5 Drawing Sheets

LOW STANDBY LEAKAGE IMPLEMENTATION FOR STATIC RANDOM ACCESS MEMORY

FIELD OF INVENTION

Embodiments of the present disclosure relate to memory architectures and more particularly to low standby leakage implementation for static random-access memory

BACKGROUND

Big percentage of standby leakage current in Static Random-Access Memory (SRAM) typically originates from bitcell arrays which store data. There are two major components of this leakage current from the bitcell array. First is the leakage current from an inverter latch which is directly dependent on power supply voltage. Second is the leakage current through pass-gate to bitlines. There are some techniques to reduce the second component, most notably floating bitlines mode. For the first component, the best possible method is to lower the power supply voltage up to retention voltage. However, in this case, performing any read/write operation with the lower power supply voltage is not possible. Hence, usually, memories at chip level from which active read/write operations are expected are kept at full power supply voltage. Other memory bitcell arrays are put into lower power supply voltage which is called deep sleep retention mode. There is a timing penalty when memory is kept in the deep sleep retention mode since the memory requires significant wake-up time generally in the range of 5 ns-100 ns. Hence, in such scenarios, no active operation can be performed from such memory until full wake-up happens.

FIG. 1 depicts a traditional SRAM architecture. A big memory is built by combining smaller memories of size generally in the range of 0.25 Mb-1 Mb. A small memory is made generally of 1-8 banks, such as decoder slice 5A-N. As shown in FIG. 1, in traditional architecture, power headers 15A-B for the bitcell array 25 to reduce the power supply voltage 20A-B are placed in local input output (IOs) 10A-B. Currently, in bitcell column, all bitcells have a common bitline pair (such as BL & BLB) and a common power supply. Further, in this architecture, the power supply voltage 20A-B, the power headers 15A-B and retention power header are placed in the local IOs 10A-B and hence there is no way to break the power supply voltage 20A-B. Further, the power supply voltage (Vdd) 20A-B are connected to all bitcells of a column. The power supply voltage (Vdd) 20A-B of all columns are also shorted in the local IOs 10A-B. In traditional architecture, both periphery and the bitcell array 25 (in retention mode) wake-up from the deep sleep retention mode to normal mode, thereby it takes a long time to wake-up memory.

Hence, there is a need for an improved SRAM architecture to achieve low standby leakage to address the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

In accordance with an embodiment of the present disclosure, a memory architecture for optimizing leakage currents in standby mode is disclosed. The memory architecture includes a plurality of local TO slices in row direction. Each of the plurality of local TO slice includes one or more bitline pair(s) running in a column direction for reading and writing in the memory bitcell and a plurality of power supply rails running in the column direction. Further, the memory architecture includes a plurality of memory bitcell arrays running in the row direction and the column direction. The plurality of memory bitcell arrays includes a plurality of the memory bitcells. The plurality of the memory bitcells have a common bitline pair and common power supply per column. Further, the memory architecture includes a plurality of memory segments configured to operate in one or more modes of operations. The plurality of memory segments includes a plurality of decoder slice. Each of the plurality of decoder slice includes a plurality of wordlines running in the row direction. A decoder block consisting of a plurality of decoder slices will have, at least one array power header configured for controlling leakage currents and a retention header. Each of the plurality of power supply rails running in the column direction are segmented within one or more decoder slice to form one or more segmented power supply node.

In accordance with another embodiment of the present disclosure, a method for optimizing leakage currents in SRAM is disclosed. The method includes providing array power header and retention header within decoder slice(s) of each memory segment for controlling leakage currents within each of memory bitcells within each memory segment. Further, the method includes segmenting power supply rails running in a column direction within each of the memory bitcell array to form one or more segmented power supply nodes. Furthermore, the method includes controlling mode of operations of one or more memory segments including the decoder slice by controlling power supply to the array power headers and the retention header within the decoder slice(s). The controlled mode of operations of the one or more memory segments results in reduced leakage currents within each of the memory bitcells and wherein voltage of the power supply rails is lowered, but still higher than retention voltage.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF DRAWINGS

The disclosure will be described and explained with additional specificity and detail with the accompanying figures in which.

Figure 1:
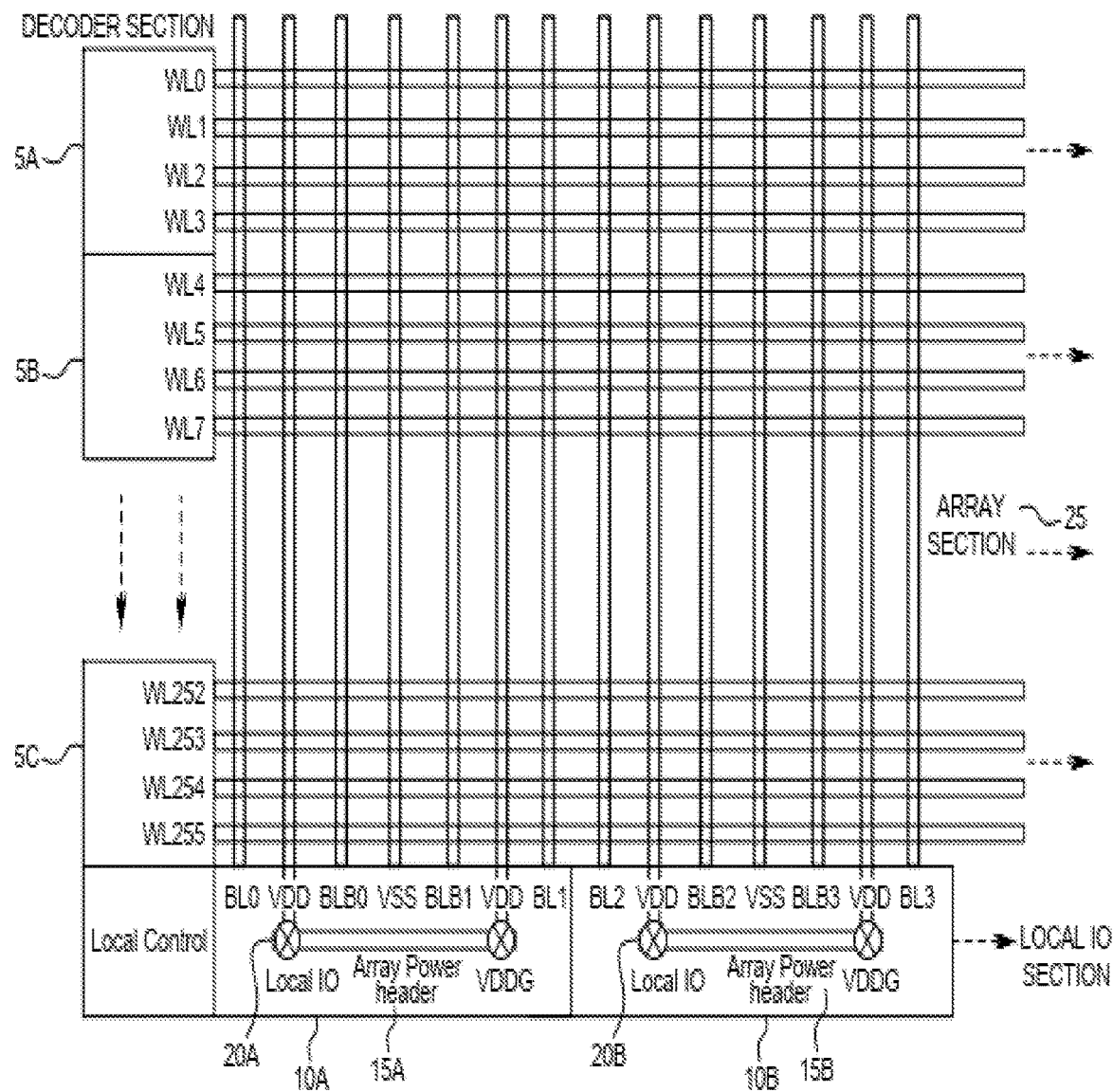
FIG. 1 is a block diagram illustrating traditional static random-access memory (SRAM) architecture according to prior art.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION OF THE DISCLOSURE

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

The terms "comprise", "comprising", or any other variations thereof, are intended to cover a non-exclusive inclusion, such that one or more devices or subsystems or elements or structures or components preceded by "comprises . . . a" does not, without more constraints, preclude the existence of other devices, sub-systems, additional sub-modules. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

A computer system (standalone, client or server computer system) configured by an application may constitute a "module" (or "subsystem") that is configured and operated to perform certain operations. In one embodiment, the "module" or "subsystem" may be implemented mechanically or electronically, so a module may comprise dedicated circuitry or logic that is permanently configured (within a special-purpose processor) to perform certain operations. In another embodiment, a "module" or "subsystem" may also comprise programmable logic or circuitry (as encompassed within a general-purpose processor or other programmable processor) that is temporarily configured by software to perform certain operations.

Accordingly, the term "module" or "subsystem" should be understood to encompass a tangible entity, be that an entity that is physically constructed, permanently configured (hardwired) or temporarily configured (programmed) to operate in a certain manner and/or to perform certain operations described herein.

Figure 2:
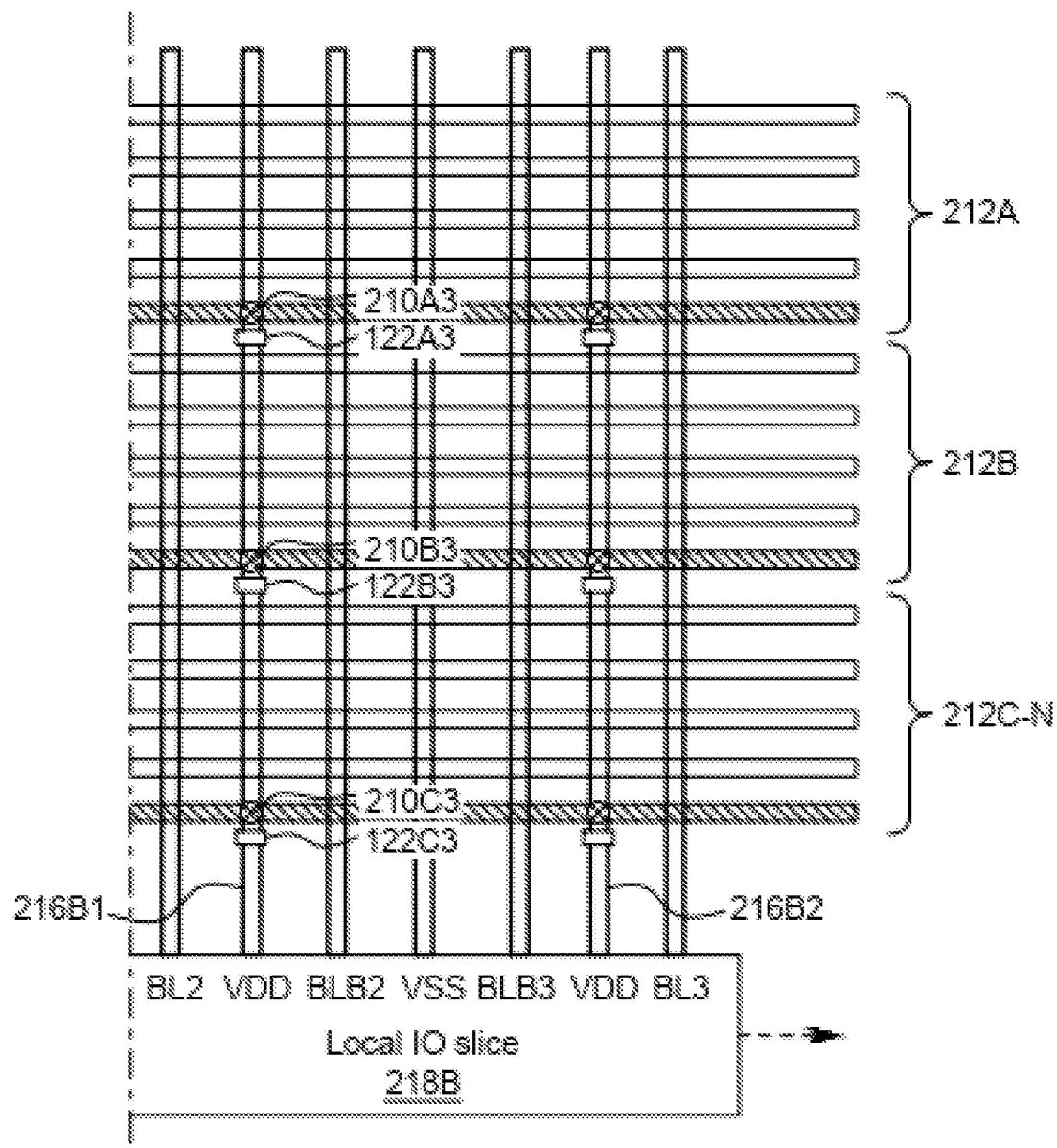
FIG. 2 is a block diagram illustrating static random-access memory (SRAM) architecture capable of optimizing standby leakage currents, in accordance with an embodiment of the present disclosure.
Figure 2:
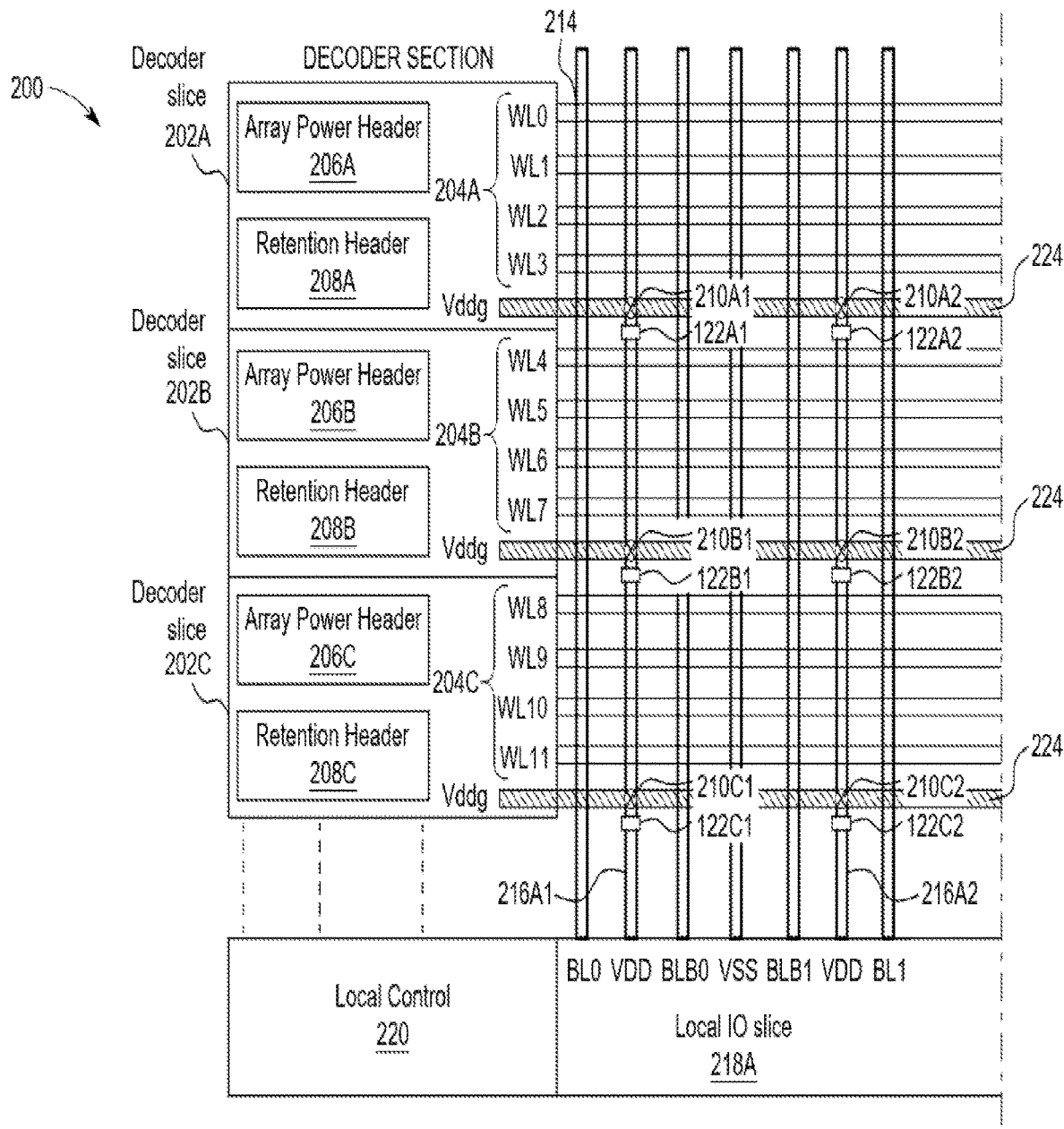
Figure 3:
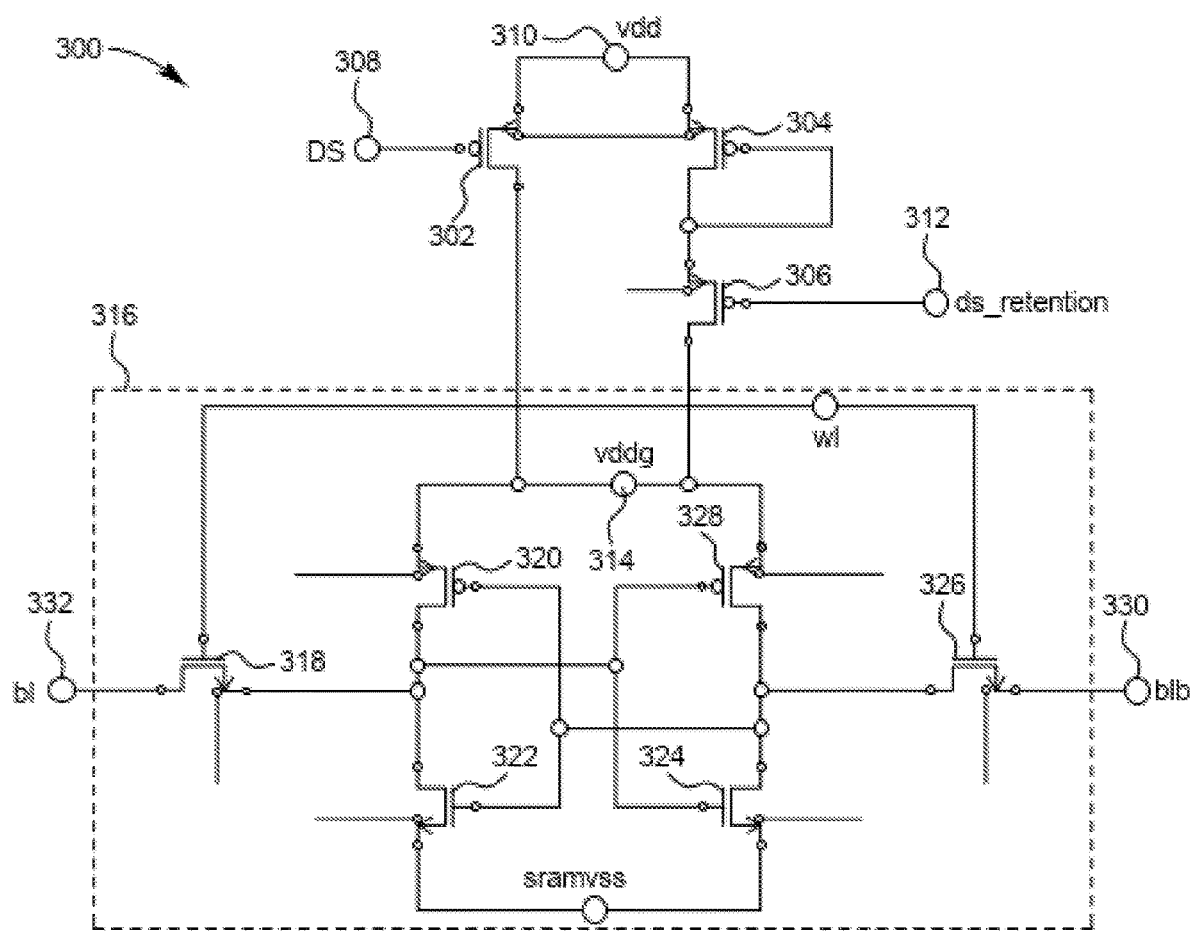
FIG. 3 is a schematic representation of array power header with retention header, in accordance with an embodiment of the present disclosure.
Figure 4:
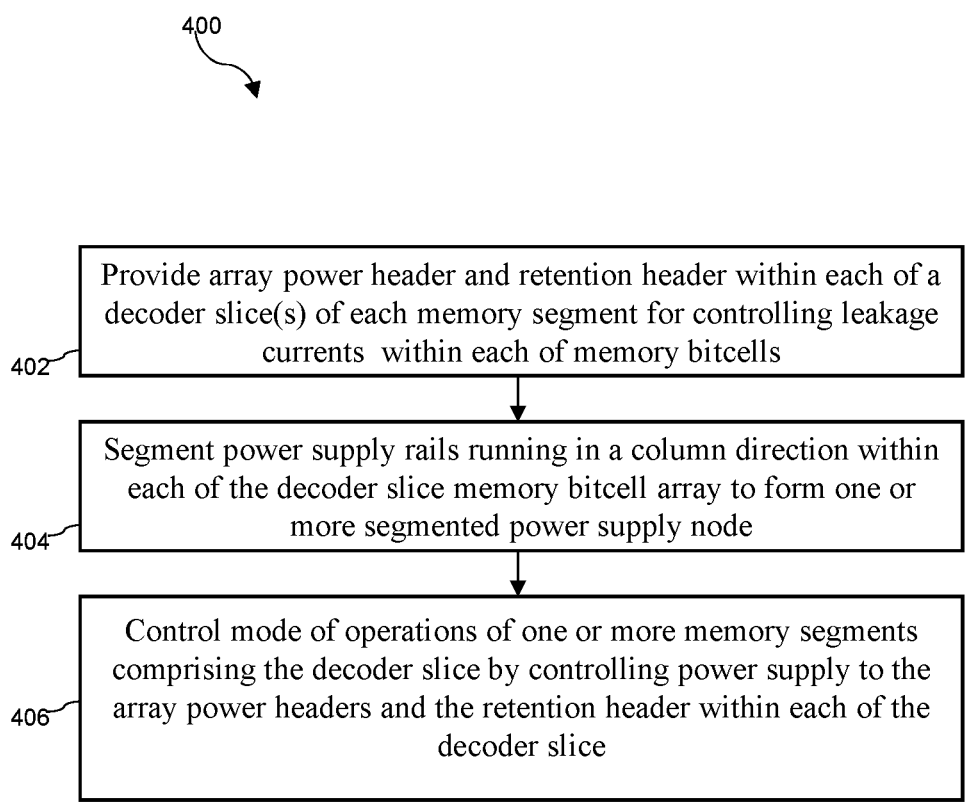
FIG. 4 is a process flow diagram illustrating an exemplary method for optimizing leakage currents in standby mode of SRAM, in accordance with an embodiment of the present disclosure.

Referring now to the drawings, and more particularly to FIGS. 2 through 4, where similar reference characters denote corresponding features consistently throughout the figures, there are shown preferred embodiments and these embodiments are described in the context of the following exemplary system and/or method.

FIG. 2 is a block diagram illustrating static random-access memory (SRAM) architecture 200 capable of optimizing leakage currents, in accordance with an embodiment of the present disclosure. The SRAM architecture 200 comprises a plurality of local IO slices 218A-N in row direction. Each of the plurality of local IO slice 218A-N comprises one or more bitline pair(s) running in a column direction for reading and writing in the memory bitcell 214. Further, each of the plurality of local IO slice 218A-N comprises a plurality of power supply rails 216A-N running in the column direction. Further, the SRAM architecture 200 comprises a plurality of memory bitcell arrays 212A-N running in the row direction and the column direction. The plurality of memory bitcell arrays 212A-N comprises a plurality of the memory bitcells 214. The plurality of the memory bitcells 214 have a common bitline pair and common power supply per column. Furthermore, the SRAM architecture 200 comprises a plurality of memory segments configured to operate in one or more modes of operations. The plurality of memory segments comprises a plurality of decoder slice 202A-N. Each of the plurality of decoder slice 202A-N comprises a plurality of wordlines 204A-N running in the row direction. Further, each of the plurality of decoder slice 202A-N comprises at least one array power header 206A-N configured for controlling leakage currents. Furthermore, each of the plurality of decoder slice 202A-N comprises a retention header 208A-N. Each of the plurality of power supply rails 216A-N running in the column direction are segmented within the plurality of decoder slice 202A-N to form one or more segmented power supply node 210A-N. Each segmented power supply node 210A-N is shorted with a horizontal wire 222A-N in row direction and is electrically coupled to each of the plurality of power supply rails 216A-N of respective memory segment. The segmented power supply node 210A-N is connected to output of the at least one array power header 206A-N and the retention header 208A-N of the plurality of decoder slice(s) 202A-N of the respective memory segment.

In an embodiment, the one or more modes of operations are controlled by controlling the plurality of power supply rails 216A-N to the at least one array power headers 206A-N and the retention header 208A-N within respective plurality of decoder slice(s) 202A-N. The one or more modes of operations comprises normal mode, deep sleep retention mode and shutdown mode.

In an embodiment, the at least one array power header 206A-N, the retention header 208A-N and a pmos transistor connected to the retention header 208A-N, in combination, is configured to control wake-up current and wake-up time of the plurality of memory segments from deep sleep retention mode to normal mode.

During operation, a first set of the plurality of memory segments is selected for operating in normal mode and a second set of the plurality of memory segments is selected for operating in deep sleep retention mode during the normal mode of operation. The at least one array power header 206A-N of the selected first set of the plurality of memory segment(s) is activated during the normal mode of operation by a high logic value of a decoder/segment select input. If one of the decoder slice, say for example, 202A, is selected in the memory segment, the array power header, say 206A of that memory segment turns ON. Further, the at least one array power header 206A-N of the selected second set of the plurality of memory segments is deactivated when the memory is required to be switched to the deep sleep retention mode by switching the decoder/segment select input to a logic value 0 and ds_retention input to a lower voltage value. In the deep sleep retention mode, voltage of input VDDg is decreased from full voltage to a voltage value higher than a retention voltage needed to retain data in the memory bitcell 214. Also, the at least one array power header 206A-N of the plurality of memory segments and all pmos transistors connected to the retention header 208A-N of the plurality of memory segments are deactivated during shutdown mode.

As shown in FIG. 2, only the plurality of power supply rails 216A-N running in the column direction is segmented and the plurality of power supply rails 216A-N of all columns of a memory segment is connected with a horizontal wire 222 which extends to the wordline 204A-N of the decoder slice 202A-N. The array power header 206A-N and retention headers 208A-N are placed in this wordline area 204A-N in this SRAM architecture 200. Since, the plurality of power supply rails 216A-N is segmented into smaller units inside a single array 212A-B, hence it is possible to keep plurality of power supply rails 216A-N ON of the active memory segments and keep all other plurality of power supply rails 216A-N of the inactive memory segments to deep sleep retention mode. The decoder/segment select input is used as the activation signal of the memory segment. Hence, if a decoder slice 202A-N is selected, then the power supply rail 216A-N of that memory segment is switched to full power through the respective power header 206A-N. Since the capacitance of this segmented power supply node 210A-N is not too high, so it's wake-up can be done with small setup time for the decoder select signal. In other words, at the cost of small setup time for the decoder select signal, the switching of the power header of the respective memory segment can be done. Therefore, there is no need for no-operation cycle(s) when changing the memory segments. The time taken for the power supply nodes 210A-N to rise from retention voltage to about full power supply voltage is close to bitline pre-charge time. Hence, this SRAM architecture 200 does not change the function of the memory and provides lower standby leakage current. In case of a floating bitline architecture, timing penalty to cycle time or access time or setup time of this architecture shall not exist. However, in case of any other architectures, either cycle time penalty or access time penalty or setup time penalty shall exist, for the time taken by power rail to reach from retention voltage to full rail voltage. There shall also be area penalty in cutting the plurality of power supply rails 216A-N in smaller segments, however if there is a strap cell used in the array 212A-N, then the plurality of power supply rails 216A-N are cut inside the strap cell without any area penalty. For example, let us say that the memory has 4 banks (also referred herein as decoder slices 202A-N) with each bank having 256 rows. Let us say that there is a strap cell required for every 64 rows. In this case, the SRAM architecture 200 keeps only 64 rows in full power and the remaining (1024−64)=960 rows into deep sleep retention power mode. This architecture 200 thus saves leakage current for 960 rows. Since in this example, a strap cell already exists, cutting or segmented the plurality of power supply rails 216A-N inside the strap cell shall not cost any additional area.

In an embodiment, although FIG. 2 depicts only one decoder as a segment, it should be understood by a person skilled in the art that the SRAM architecture 200 may comprise more than one decoder as well as a segment. In the former case, where only one decoder is used as a segment, the decoder select input decides the segment enabled/disabled. However, in the latter case, if more than one decoder is used as a segment then a segment select input may be used.

FIG. 3 is a schematic representation of array power header 206A-N with retention header 208A-N, in accordance with an embodiment of the present disclosure. As shown in FIG. 3, 6T memory bitcell 316 has power gating to control leakage current during deep sleep retention (power gating) modes. For normal mode, MOS phdr 302 is turned ON by keeping the deep sleep pin DS 308 low. This provides full power to the 6T memory bitcell 316. When memory is to be put to sleep in the deep sleep retention mode, then the MOS phdr 302 is turned OFF by switching the deep sleep pin DS 308 high and pin ds_retention 312 low. In this deep sleep retention mode, voltage of pin Vddg 314 is lowered from full voltage to above retention voltage. The retention voltage is voltage where data stored in the 6T memory bitcell 316 is guaranteed to keep its state and does not lose its data value. The current is supplied by MOS rt_pmos 306 and rt_diode 304. The MOS rt_pmos 306 and the rt_diode 304 provides only a small amount of the current only to hold the segmented power supply nodes 210A-N above the retention voltage. Since Vddg 314 voltage is reduced in the deep sleep retention mode, the leakage current also is reduced. When the deep sleep retention mode is not needed, which is referred as 'shutdown mode', then both the array power header 302 and the retention header, which are the rt_diode 304 the MOS rt_pmos 306, are turned off, thereby reducing the leakage current the most. Hence, the leakage current order is as follows: the normal mode corresponds to highest leakage current, the deep sleep retention mode corresponds to medium leakage current and the shutdown mode corresponds to lowest leakage current.

Although FIG. 3 depicts one of the array power header 206A, it should be understood by a person skilled in the art that the various components as shown in this FIG. 3 are same for all the array power headers 206A-N and the same explanation as above shall apply for rest of the array power headers 206A-N.

FIG. 4 is a process flow diagram illustrating an exemplary method 400 for optimizing leakage currents in standby mode of SRAM, in accordance with an embodiment of the present disclosure. At step 402, an array power header 206A-N and a retention header 208A-N are provided within decoder slice(s) 202A-N of each memory segment for controlling leakage currents within each of memory bitcells 214 within each memory segment. At step 404, power supply rails 216A-N running in a column direction are segmented within each of the memory bitcell array 212A-N to form one or more segmented power supply node 210A-N. At step 406, mode of operations of the memory segments comprising the decoder slice 202A-N are controlled by controlling the power supply rails 216A-N to the array power headers 206A-N and the retention header 208A-N within the decoder slice(s) 202A-N. The controlled mode of operations of the memory segments results in reduced leakage currents within the each of the memory bitcells 214. The mode of operations comprises normal mode, deep sleep retention mode and shutdown mode. In deep sleep retention mode, voltage of the unselected segments of power supply rails 216A-N is lowered to higher than the retention voltage. Each of the one or more segmented power supply node 210A-N is shorted with a horizontal wire 222A-N in row direction and is electrically coupled-to the power supply rails 216A-N running in the column direction within that respective memory segment. The one or more segmented power supply node 210A-N are connected to output of the array power header 206A-N and the retention header 208A-N of the decoder slice(s) 202A-N of that respective memory segment.

In controlling the power supply rails 216A-N to the array power headers 206A-N and the retention header 208A-N within the decoder slice(s) 202A-N of that segment, the method 400 comprises selecting the one or more memory segments comprising the decoder slice(s) 202A-N for performing read/write operations in the normal mode. Further, the method 400 comprises activating the array power header 206A-N of the selected one or more memory segments to operate in the normal mode by a logic value 1 of decoder/segment select input 308. Further, the method 400 comprises simultaneously deactivating the array power header 206A-N of unselected memory segments to operate in the deep sleep retention mode by switching the decoder/segment select input 308 (also referred herein as deep sleep pin) to a logic value 0 and the ds_retention input 312 to a lower voltage value. A voltage value of input Vddg 314 of the array power header 206A-N is lowered from full voltage to a voltage value higher than a retention voltage.

In controlling the power supply rails 216A-N to the array power headers 206A-N and the retention header 208A-N within the decoder slice(s) 202A-N of that segment, the method 400 further comprises deactivating the array power header 206A-N and the retention headers 208A-N within the decoder slice(s) 202A-N to operate in the shutdown mode.

Various embodiments of the present system provide a technical solution to the problem of reducing standby leakage current of the SRAM architecture 200 with minimal impact on three parameters of the memory which are Performance, Power and Area. The present architecture 200 also reduces wake-up time of the SRAM from deep sleep retention mode to the normal mode since most of the memory segments remain in the deep sleep retention mode, in the normal mode of the disclosed embodiments. This makes it easier to adopt the deep sleep retention mode at the next level of integration. For example, for normal (read/write) mode of operation to occur, first, the selected memory segments of the bitcell array 212A-N wake up to nominal voltage level and then the unselected memory segments of the bitcell array 212A-N go to the deep sleep retention mode. In this way, the leakage current can be saved more than 50% for the unselected memory segments, even when the memory is in standby mode.

Unlike the traditional architecture, where both periphery and array (in deep sleep retention mode) wake-up from the deep sleep retention mode to normal mode, in the present SRAM architecture 200, only periphery is woken up and the array continues to be in the deep retention mode. When the active cycle arrives, then the selected memory segment is woken-up from the deep sleep retention mode to full power. Thus wake-up time from the deep sleep retention mode to normal mode reduces significantly.

In the SRAM architecture 200, these array power headers 206A-N, and the retention headers 208A-N are placed in the decoder slices 202A-N. These array power header 206A-N, and the retention header 208A-N is distributed evenly in every decoder slices 202A-N. Further, the power supply rails 216A-N of the bitcell array 212A-N are segmented even inside a single memory segment. Specifically, the power supply rails 216A-N Vdd for the bitcell array 212A-N is broken into segments and shorted and then brought in the decoder slices 202A-N, where array power header 206A-N is available. Hence, only selected memory segment has full power supply to perform read or write operations, whereas all other memory segments and decoder slices 202A-N have a lower power supply close to the retention voltage of the memory bitcell 214. Hence, if a memory is segmented into 16 independent memory bitcell array 212A-N supplies, then the leakage currents in 15 segments are saved without any timing penalty. Therefore, with proper control signals, one or more selected memory segments are woken up for operation in the normal mode while all other memory segments are still in the deep sleep retention voltage mode and hence saving standby leakage current heavily.

Further, the plurality of bitlines are not broken, hence the memory segments of the bitcell array 212A-N are combined to use the local IO 218A-N for read or write operations. This reduces area overhead of having multiple local IOs 218A-N. Further, since capacitance of the power supply rails 216A-N is generally double of the plurality of bitlines, this means that wake-up of the power supply rails 216A-N from the retention voltage to full power supply is easily achieved before the wordline 204A-N arrives. In an exemplary embodiment, best usage of this SRAM architecture 200 may be to use floating bitline architecture with one pipeline stage to provide best possible PPAL (Power Performance Area Leakage).

When switching from one memory segment to another memory segment, address to the memory segment changes which in turn powers-on newly selected memory segments and powers-off other deselected memory segments. Since the memory segment has small capacitance on power, such a memory segment can be powered up in around 20% or less of active cycle time and thus does not cause any timing penalty. Therefore, the memory shall still be working as a normal memory from outside, without any no-operation penalty for switching memory segments.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer-readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random-access memory (RAM), a read-only memory (ROM), a rigid magnetic disk and an optical disk. Current examples of optical disks include compact disk-read only memory (CD-ROM), compact disk-read/write (CD-R/W) and DVD.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments may include a hardware configuration of an information handling/computer system in accordance with the embodiments herein. The system herein comprises at least one processor or central processing unit (CPU). The CPUs are interconnected via system bus to various devices such as a random-access memory (RAM), read-only memory (ROM), and an input/output (I/O) adapter. The I/O adapter can connect to peripheral devices, such as disk units and tape drives, or other program storage devices that are readable by the system. The system can read the inventive instructions on the program storage devices and follow these instructions to execute the methodology of the embodiments herein.

The system further includes a user interface adapter that connects a keyboard, mouse, speaker, microphone, and/or other user interface devices such as a touch screen device (not shown) to the bus to gather user input. Additionally, a communication adapter connects the bus to a data processing network, and a display adapter connects the bus to a display device which may be embodied as an output device such as a monitor, printer, or transmitter, for example.

A description of an embodiment with several components in communication with each other does not imply that all such components are required. On the contrary, a variety of optional components are described to illustrate the wide variety of possible embodiments of the invention. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

The invention claimed is:

1. A memory architecture for optimizing leakage currents in standby mode, comprising:
   a plurality of local IO slices in a first direction, wherein each of the plurality of local IO slice comprises:
      one or more bitline pair(s) running in a second direction for reading and writing in a memory bitcell; and
      a plurality of power supply rails running in the second direction;
   a plurality of memory bitcell arrays running in the first direction and the second direction, wherein the plurality of memory bitcell arrays comprises a plurality of the memory bitcells and wherein the plurality of the memory bitcells have a common bitline pair and common power supply per column; and
   a plurality of memory segments configured to operate in one or more modes of operations, wherein the plurality of memory segments comprise a plurality of decoder slices, wherein each of the plurality of decoder slices comprises:
      a plurality of word lines running in the first direction;
      at least one array power header configured for controlling leakage currents;
      a retention header, wherein the at least one array power header, the retention header, and a pmos transistor connected to the retention header, are configured to control wake-up current and wake-up time of the plurality of memory segments from deep sleep retention mode to normal mode; and
      wherein each of the plurality of power supply rails running in the second direction are segmented within the plurality of the decoder slices to form one or more segmented power supply nodes.

2. The memory architecture of claim 1, wherein each segmented power supply node is shorted with a first wire in the first direction and is electrically coupled to each of the plurality of power supply rails of respective memory segment, and wherein the segmented power supply node is connected to output of the at least one array power header and the retention header of the plurality of decoder slice(s) of the respective memory segment.

3. The memory architecture of claim 1, wherein the one or more modes of operations are controlled by controlling the plurality of power supply rails to the at least one array power headers and the retention header within respective plurality of decoder slice(s).

4. The memory architecture of claim 1, wherein the one or more modes of operations comprises normal mode, deep sleep retention mode and shutdown mode.

5. The memory architecture of claim 1, wherein a first set of the plurality of memory segments is selected for operating in normal mode and a second set of the plurality of memory segments is selected for operating in deep sleep retention mode during the normal mode of operation.

6. The memory architecture of claim 5, wherein the at least one array power header of the selected first set of the plurality of memory segment(s) is activated during the normal mode of operation by a high logic value of a decoder/segment select input.

7. The memory architecture of claim 5, wherein the at least one array power header of the selected second set of the plurality of memory segments is deactivated when the memory is required to be switched to the deep sleep retention mode by switching decoder/segment select input to a logic value 0 and ds_retention input to a lower voltage value wherein in the deep sleep retention mode, voltage of input $V_{DDg}$ is decreased from full voltage to a voltage value higher than a retention voltage needed to retain data in the memory bitcell.

8. The memory architecture of claim 1, wherein the at least one array power header of the plurality of memory segments and pmos transistor connected to the retention header of the plurality of memory segments are deactivated during shutdown mode.

9. A method for optimizing leakage currents in SRAM comprising:
provided an array power header and a retention header within decoder slice(s) of each memory segment for controlling leakage currents within each of memory bitcells within the each memory segment, wherein the at least one array power header, the retention header and a pmos transistor connected to the retention header, are configured to control wake-up current and wake-up time of plurality of memory segments from deep sleep retention mode to normal mode;
segmenting power supply rails running in a second direction within each memory bitcell array to form one or more segmented power supply node; and
controlling mode of operations of one or more memory segments comprising the decoder slice(s) by controlling the power supply rails to the array power headers and the retention header within the decoder slice(s), wherein controlled mode of operations of the one or more memory segments results in reduced leakage currents within the each of the memory bitcells and wherein voltage of the power supply rails is lowered to higher than retention voltage.

10. The method of claim 9, wherein each of the one or more segmented power supply node is shorted with a first wire in a first direction and is electrically coupled to each of the power supply rails running in the second direction within respective memory segment, and wherein the one or more segmented power supply node are connected to output of the array power header and the retention header of the decoder slice(s) within the respective memory segment.

11. The method of claim 9, wherein the mode of operations comprises normal mode, deep sleep retention mode and shutdown mode.

12. The method of claim 9, wherein controlling the power supply rails to the array power headers and the retention header within the decoder slice(s), comprises:
selecting the one or more memory segments comprising the decoder slice(s) for performing read/write operations in normal mode;
activating the array power header of the selected one or more memory segments to operate in the normal mode by a logic value 1 of decoder/segment select input; and
simultaneously deactivating array power header of unselected one or more memory segments to operate in deep sleep retention mode by switching the decoder/segment select input to a logic value 0 and ds_retention input to a lower voltage value, wherein voltage value of input $V_{ddg}$ of the array power header is lowered from full voltage to a voltage value higher than a retention voltage.

13. The method of claim 9, wherein controlling the power supply rails to the array power headers and the retention header within the decoder slice(s), further comprises: deactivating the array power header and the retention headers within the decoder slice(s) to operate in shutdown mode.

* * * * *